US012310082B1

(12) United States Patent
Reza et al.

(10) Patent No.: US 12,310,082 B1
(45) Date of Patent: May 20, 2025

(54) TRANSISTOR WITH CURVILINEAR GATE CONFIGURATION FOR IMPROVED THERMAL DISTRIBUTION

(71) Applicant: National Technology & Engineering Solutions of Sandia, LLC, Albuquerque, NM (US)

(72) Inventors: Shahed Reza, Albuquerque, NM (US); Maher Salloum, Livermore, CA (US); Brianna Alexandra Klein, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 507 days.

(21) Appl. No.: 17/728,330

(22) Filed: Apr. 25, 2022

Related U.S. Application Data

(60) Provisional application No. 63/257,950, filed on Oct. 20, 2021.

(51) Int. Cl.
*H10D 64/27* (2025.01)
*H10D 30/47* (2025.01)
*H10D 62/824* (2025.01)
*H10D 62/85* (2025.01)

(52) U.S. Cl.
CPC ......... *H10D 64/411* (2025.01); *H10D 30/475* (2025.01); *H10D 62/824* (2025.01); *H10D 62/8503* (2025.01)

(58) Field of Classification Search
CPC ........... H01L 29/42316; H01L 29/2003; H01L 29/205; H01L 29/7786; H01L 29/28114; H01L 29/66568–66659; H01L 29/66348; H01L 29/7428; H01L 29/66916; H01L 29/66515; H01L 29/66545; H01L 29/66787–66818; H01L 29/78931; H01L 21/823437–823456; H01L 21/823828–82385; H10B 51/00–50
See application file for complete search history.

(56) References Cited

U.S. PATENT DOCUMENTS

| | | |
|---|---|---|
| 3,783,349 A | 1/1974 | Beasom |
| 5,216,275 A | 6/1993 | Chen |
| 5,709,263 A | 1/1998 | Mira |

(Continued)

FOREIGN PATENT DOCUMENTS

CN 114628512 A * 6/2022

OTHER PUBLICATIONS

Abare, W. E. and Martindale, W. K., "Dose Rate Tolerant Hexfet Power Supply," IEEE Transactions on Nuclear Science, 1981, vol. NS-28, pp. 4380-4383.

(Continued)

*Primary Examiner* — Jeff W Natalini
*Assistant Examiner* — Andrew Zabel
(74) *Attorney, Agent, or Firm* — Kevin W. Bieg

(57) ABSTRACT

There is provided a transistor apparatus of the kind in which a gate electrode includes one or more gate fingers that extend laterally across a device area. At least one gate finger is not rectilinear, but instead describes two or more meanders about an average path across the device area. The meanders can be tapered such that a taper amplitude is smallest in a central part of the gate finger and increases toward end portions of the gate finger.

17 Claims, 4 Drawing Sheets

(56) References Cited

U.S. PATENT DOCUMENTS

| | | | |
|---|---|---|---|
| 6,462,522 B2 | 10/2002 | Burstein et al. | |
| 7,579,634 B2* | 8/2009 | Onodera | H10D 30/4738 257/192 |
| 7,655,944 B1* | 2/2010 | Darwish | G06F 30/23 257/E27.008 |
| 7,763,939 B2 | 7/2010 | Leibiger | |
| 7,982,243 B1* | 7/2011 | Iversen | H01L 29/0692 257/202 |
| 8,664,767 B2 | 3/2014 | Jergovic et al. | |
| 9,419,121 B1* | 8/2016 | Teo | H10D 30/472 |
| 9,536,966 B2* | 1/2017 | Ogino | H10D 30/475 |
| 12,068,216 B1* | 8/2024 | Reza | H01L 29/7786 |
| 2005/0139891 A1* | 6/2005 | Beach | H01L 29/0692 438/254 |
| 2006/0157734 A1* | 7/2006 | Onodera | H10D 30/015 257/E29.026 |
| 2006/0284261 A1* | 12/2006 | Sriram | H10D 64/411 257/E29.127 |
| 2012/0001230 A1* | 1/2012 | Takatani | H10D 30/475 257/E29.246 |
| 2013/0299878 A1* | 11/2013 | Briere | H01L 29/778 257/288 |
| 2015/0263107 A1* | 9/2015 | Kobayashi | H10D 64/257 257/367 |
| 2017/0018639 A1* | 1/2017 | Teo | H01L 29/205 |
| 2017/0025510 A1* | 1/2017 | Takeuchi | H10D 64/411 |
| 2018/0076295 A1* | 3/2018 | Norton | H01L 29/0696 |
| 2018/0308926 A1* | 10/2018 | Takahashi | H10D 30/473 |
| 2020/0235215 A1* | 7/2020 | Yamaguchi | H10D 30/475 |
| 2021/0083102 A1* | 3/2021 | Isobe | H10D 64/513 |
| 2022/0020874 A1* | 1/2022 | Fisher | H10D 62/127 |

OTHER PUBLICATIONS

Croon, J. A. et al., "Experimental Investigation of the Impact of Line-Edge Roughness on MOSFET Performance and Yield," ESSDERC '03. 33rd Conference on European Solid-State Device Research, 2003, pp. 227-230, doi: 10.1109/ESSDERC.2003.1256855.

Darwish, A. et al., "Channel Temperature Analysis of GaN HEMTs With Nonlinear Thermal Conductivity," IEEE Transactions on Electron Devices, 2015, vol. 62, pp. 840-846.

Darwish, A. M. et al., "AlGaN/GaN HEMT With Distributed Gate for Channel Temperature Reduction," IEEE Transactions on Microwave Theory and Techniques, 2012, vol. 60, pp. 1038-1043.

Beigzadeh, R. and Ozairy, R., "Developing Predictive Models for Analysis the Heat Transfer in Sinusoidal Wavy Channels," Thermal Science and Engineering Progress, 2019, vol. 14, 9 pages.

Alihosseini, Y. et al., "Effect of a Micro Heat Sink Geometric Design on Thermo-Hydraulic Performance: A Review," Applied Thermal Engineering, 2020, vol. 170, 25 pages.

Nakhchi, M. E., "Experimental Optimization of Geometrical Parameters on Heat Transfer and Pressure Drop Inside Sinusoidal Wavy Channels," Thermal Science and Engineering Progress, 2019, vol. 9, pp. 121-131.

Sui, Y. et al., "Fluid Flow and Heat Transfer in Wavy Microchannels," International Journal of Heat and Mass Transfer, 2010, vol. 53, pp. 2760-2772.

Sajid, M. U. et al., "Heat Transfer Enhancement of Sinusoidal Mini-Channel Heat Sink Using MgO Nanofluid," Proceeding Books of Fourth International Conference on Advances in Mechanical Engineering: ICAME 2018, pp. 85-93.

Pandya, N. S. et al., "Heat Transfer Enhancement with Nanofluids in Plate Heat Exchangers: A Comprehensive Review," European Journal of Mechanics / B Fluids, 2020, vol. 81, pp. 173-190.

Lyu, X. et al., "Vertical Power Hk-MOSFET of Hexagonal Layout," IEEE Transactions on Electron Devices, 2013, vol. 60, pp. 1709-1715.

Park, J. and Lee, J.-H., "A 650 V Super-Junction MOSFET With Novel Hexagonal Structure for Superior Static Performance and High BV Resilience to Charge Imbalance: A TCAD Simulation Study," IEEE Electron Device Letters, 2017, vol. 38, pp. 111-114.

Sahoo, A. K. et al., "Thermal Analysis of AlN/GaN/AlGaN HEMTs Grown on Si and SiC Substrate through TCAD Simulations and Measurements," 2016, Proceedings of the 11th European Microwave Integrated Circuits Conference, London, England, pp. 145-148.

Ionesco, V. et al., "Thermal-Hydraulic Performance Modelling of a Sine-Shaped Wavy Channel for Electronics Cooling Applications," Proceedings of SPIE, 2018, vol. 10977, pp. 109772D-1-109772D-9.

Yang, S-H. and Huang, C-H., "An Inductor Model for Analyzing the Performance of Printed Meander Line Antennas in Smart Structures," Journal of Electromagnetic Analysis and Applications, 2014, vol. 6, pp. 244-252.

* cited by examiner

TRANSISTOR WITH CURVILINEAR GATE CONFIGURATION FOR IMPROVED THERMAL DISTRIBUTION

CROSS-REFERENCE TO RELATED APPLICATION

This application claims priority to U.S. Provisional Application Ser. No. 63/257,950, filed Oct. 20, 2021 under the title, "TRANSISTOR WITH CURVILINEAR GATE CONFIGURATION FOR IMPROVED THERMAL DISTRIBUTION," the entirety of which is hereby incorporated herein by reference.

ACKNOWLEDGEMENT OF GOVERNMENT SUPPORT

This invention was made with United States Government support under Contract No. DE-NA0003525 between National Technology & Engineering Solutions of Sandia, LLC and the United States Department of Energy/National Nuclear Security Administration. The United States Government has certain rights in this invention.

FIELD OF THE INVENTION

This invention relates to power transistors, and more particularly to high electron mobility transistors (HEMTs).

ART BACKGROUND

Over the last decade, solid-state devices have played an increasing role in high-voltage and high-power electronics. This has been possible, in part, because of progress in nitride-based device technologies. Among other things, this progress has led to advanced designs for aluminum gallium nitride/gallium nitride (AlGaN/GaN) high electro-mobility transistors (HEMTs) and ultra-wide bandgap (UWBG) AlGaN/AlGaN HEMTs.

GaN and AlGaN are attractive materials for high-power applications because they offer high electron saturation velocity, high thermal conductivity, wide bandgap, and high critical electric field. Because of these properties, integrated circuits based on GaN, for example, can handle higher areal power densities than silicon-based devices.

However, even GaN-based and AlGaN-based HEMT devices are subject to degraded reliability due to heating. This remains a critical issue because of increasing demand for higher power densities. A common rule of thumb in this regard is that a rise in channel temperature of 10° C. will reduce the device lifetime by half.

Hot spots in high-power devices are of particular concern. Typically, high-power devices are designed with multiple channels; that is, with multiple gate fingers. Temperatures run higher at the inner gates because of thermal confinement by the outer gates that surround them. The thermal confinement is exacerbated because the thermal resistance of the substrate material increases with temperature.

Several methods have been proposed to reduce the channel temperature. These include increasing the spacing between the adjacent gates and segmenting the channel to distribute the heat sources. Approaches like those, however, would also increase the total device area, which is economically unattractive because it would lead to higher wafer costs.

Accordingly, a need remains for new device designs that can extend lifetimes by distributing the generated heat more evenly over the device area.

SUMMARY OF THE INVENTION

We have devised a new device geometry that can reduce the channel temperature and make it more uniform by distributing the heat more evenly over the device area. This new geometry includes gate fingers that extend laterally across the device area, thereby defining a gate width.

However, our new gate fingers are unlike conventional gate fingers, which are typically rectilinear. Instead, we have devised a meandering gate geometry in which each one of several gate fingers describes two or more meanders about an average path across the device area. By "meander" is meant a single arc that leaves the average path and returns to it, and that is preceded and/or followed by another such arc with opposite curvature relative to the average path. The "average path" in this regard is a notional path that may be straight or curvilinear. It provides a baseline relative to which the meanders are defined. The average path may be "average" in a strict mathematical sense, but that is not a requirement.

Unlike meandering gates known in the prior art, our meandering gates are tapered. By "tapered" is meant that the amplitude of the meanders is smallest near the center of the gate finger and increases toward the ends of the gate finger.

Accordingly, the invention relates to a transistor apparatus of the kind in which a gate electrode includes one or more gate fingers that extend laterally across a device area. At least one gate finger describes two or more meanders about an average path across the device area. The meanders are tapered such that a taper amplitude is smallest in a central part of the gate finger and increases toward end portions of the gate finger.

Various embodiments include a plurality of gate fingers, in which each gate finger describes two or more tapered meanders. In various embodiments, each of the plural gate fingers has an average path, and at least two of the average paths are curved paths.

Each of the gate fingers may be constituted by a major portion and relatively small end portions that collectively take up less than half the total length of the gate finger. An end portion may, for example, connect the major portion of the gate finger to a gate manifold. In various embodiments, a major portion of at least one of the gate fingers describes an amplitude-modulated sinusoid. In some such embodiments, the amplitude-modulated sinusoid may have a period that is also modulated.

In embodiments, the transistor apparatus comprises at least one HEMT. In specific examples, the at least one HEMT is an AlGaN/GaN HEMT.

In embodiments, the amplitude of each meander is a smooth function of lateral position along an axis that crosses the device area. In some such embodiments, the amplitude increases monotonically from the central part of the gate finger toward the end portions of the gate finger.

In embodiments, each gate finger has at least three meanders. In some such embodiments, the total number of meanders in each gate finger is no more than eight.

In embodiments, each gate finger has a span, which is here defined as a straight-line end-to-end distance that the gate finger extends across the device area. At least one of the gate fingers with tapered meanders has an arc length at least 30% greater than its span. In more specific embodiments, at least one gate finger with tapered meanders has an arc length greater than its span by 30%-200%.

In embodiments, the transistor apparatus comprises a plurality of p gate fingers having tapered meanders. Each of the gate fingers has a span s, and the plurality of p gate fingers has a total gate width at least 30% greater than the total gate width of p rectilinear fingers of span s. In more specific embodiments, the total gate width is greater than the total gate width of p rectilinear fingers of span s by 30%-200%.

In embodiments, a major portion of at least one gate finger describes an amplitude-modulated sinusoid with a linear taper such that the amplitude is proportional to a distance measured from a central point on the gate finger. In other embodiments, the amplitude-modulated sinusoid has a quadratic taper such that the amplitude is proportional to the square of a distance measured from a central point on the gate finger.

In embodiments, at least two gate fingers extend laterally across the device area. In some such embodiments, all of the gate fingers that extend laterally across the device area have tapered meanders.

BRIEF DESCRIPTION OF THE DRAWINGS

FIG. 4A is a temperature map of a design in which six gate fingers are conformed as identical sinusoids of constant amplitude and period. FIG. 4B is a temperature map of a design in which the six identical gate shapes are tapered sinusoids with a modulated amplitude (labeled Quadratic Tapered 2 in Table 1).

DETAILED DESCRIPTION

Figure 1A:
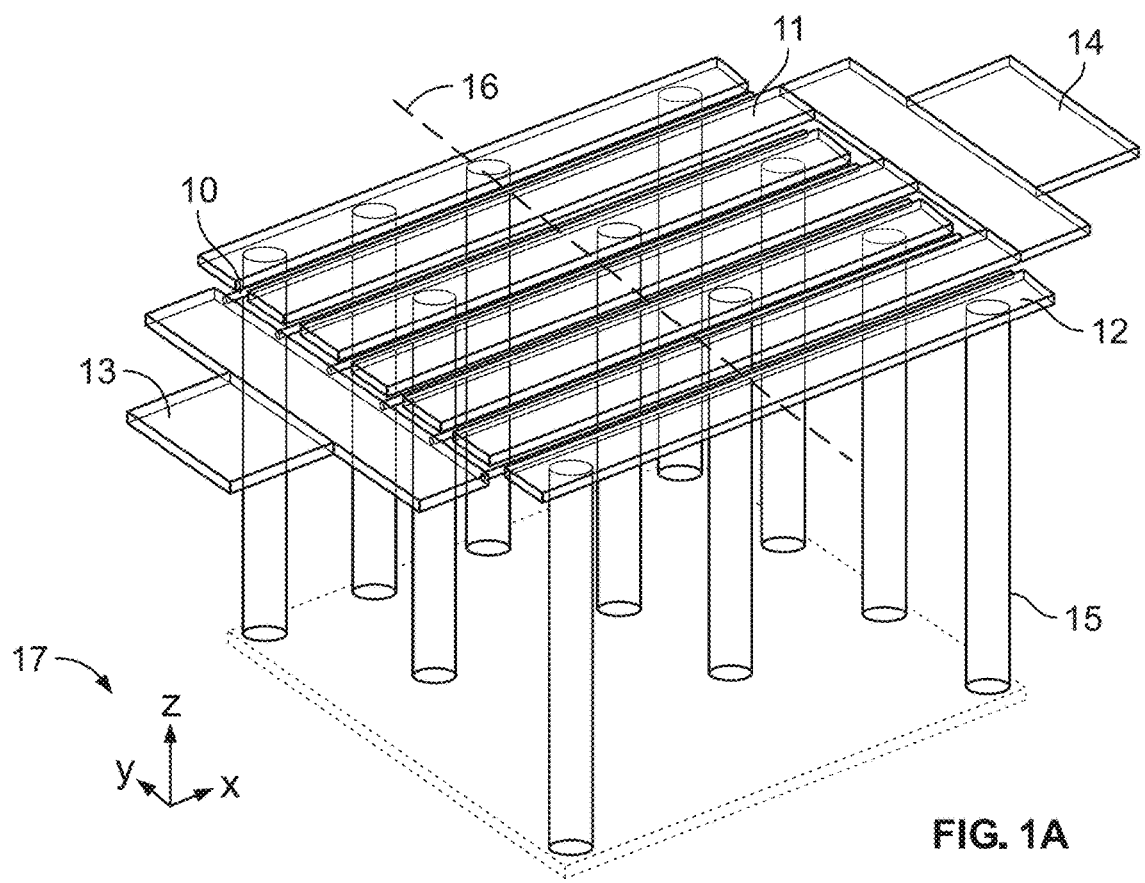
FIG. 1A is a perspective view of a layout for a typical multi-finger AlGaN/GaN HEMT of the prior art. A temperature distribution was calculated by numerical simulation along the cut-line indicated in the figure.

FIG. 1A is a perspective view of a layout for a typical multi-finger AlGaN/GaN HEMT of the prior art. The example shown has six gate fingers 10, three drain fingers 11, and four source islands 12. The six gate fingers are fed by a gate manifold 13, shown on the left. The three drain fingers are fed by a drain manifold 14, which is shown on the right.

The source islands are connected to ground through a plurality of vias 15, some of which are included in the figure.

A broken line 16 superposed on the drawing is a cut-line along which we calculated a theoretical temperature distribution, as explained below.

The total device periphery is determined by the width of the gate (i.e., the arc length through which the gate traverses over the mesa), multiplied by the number of gates. A set 17 of coordinate axes is included in the figure. As defined in the figure, each gate finger extends laterally in the x-direction across the device area, the cut-line extends in the y-direction, and the z-axis is perpendicular to the device substrate.

Figure 1B:
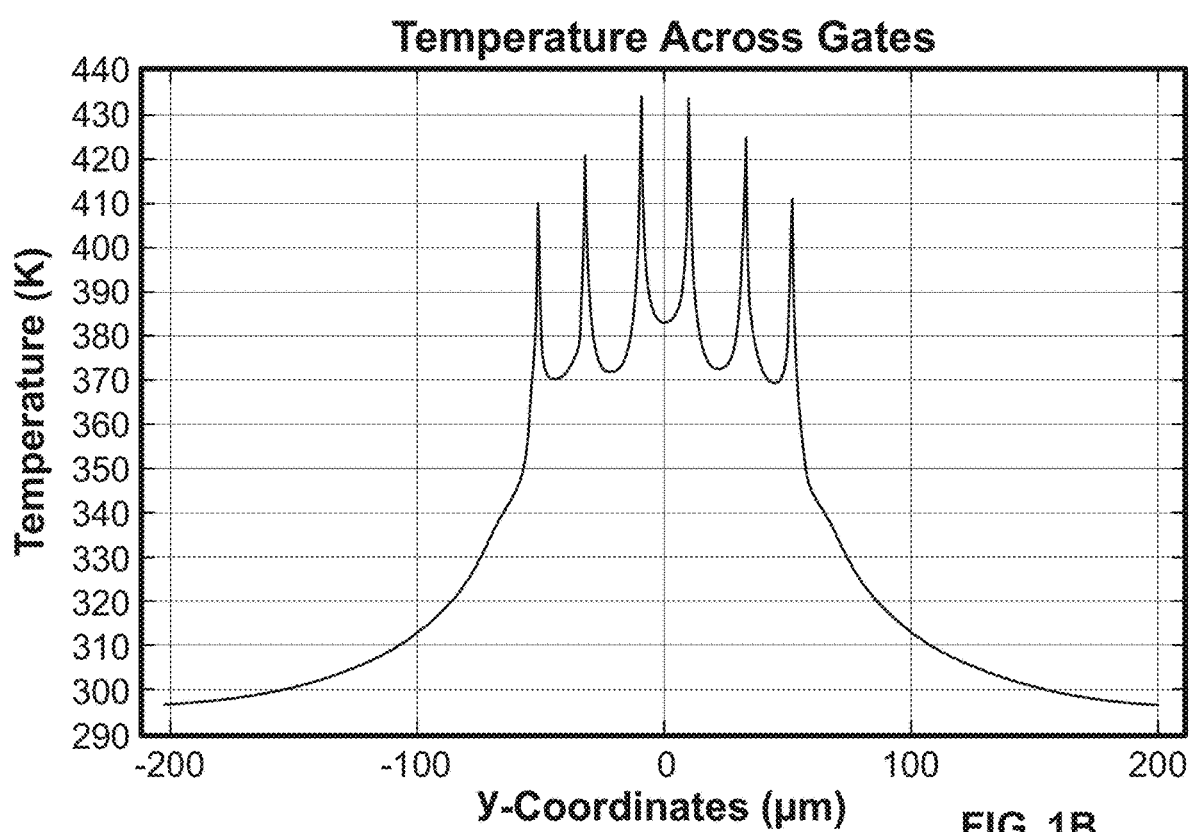
FIG. 1B is a graph of the calculated temperature distribution along the cut-line of FIG. 1A.

FIG. 1B is a graph of the temperature distribution along the cut-line of FIG. 1A, as predicted by numerical simulation. Most of the heat is dissipated in the channel area near the gate, giving rise to the six peaks seen in the temperature profile. As is apparent in the figure, the temperature at the inner gates is higher than at the outer gates. This is due to thermal confinement as explained above.

It is common for high-power devices to have more gate fingers than the six shown here. The number of gate fingers in HEMTs, for example, can vary widely, depending on the application and other factors. HEMTs for radio-frequency (RF) applications will generally have up to twelve fingers, whereas a HEMT for power conversion may have as many as fifty fingers, or even more. With increasing numbers of fingers, there can be even greater differences in temperature between the middle and the periphery of the gate array.

Because the heat sources in the HEMT of FIG. 1A are distributed in straight lines parallel to the gates, the resulting temperature gradients will be generally directed perpendicular to the gates, i.e. along the y-axis according to the figure.

It is known that in fluid-flow systems for cooling and heat exchange, winding or meandering heating elements can transfer heat with enhanced efficiency because the temperature gradients are distributed in both the x-direction and the y-direction. This is discussed, for example, in M. U. Sajida et al., "Heat Transfer Enhancement of Sinusoidal Mini-Channel Heat Sink Using MgO Nanofluid," *Proc. of 4th Int. Conf. on Advances in Mechanical Engineering: ICAME 2018*, and in R. Beigzadeh et al., "Developing predictive models for analysis the heat transfer in sinusoidal wavy channels," *Thermal Science and Engineering Progress* 14 (2019) 100425. To our knowledge, however, similar principles have not been exploited, until now, for thermal management in solid state devices.

Meandering microchannels for liquid cooling of electronic devices are discussed in Y. Alihosseini et al., "Effect of a micro heat sink geometric design on thermo-hydraulic performance: A review," *Applied Thermal Engineering* 170 (2020) 114974. The focus there, however, is on the fluid dynamics of the liquid coolant and on how it is affected by the shape of the microchannels.

Meandering gates are known in the art. For example, a design with a meandering in-phase sinusoidal gate is reported in J. A. Croon et al., "Experimental investigation of the impact of line edge roughness on MOSFET performance and yield," 2003 *Proc. ESSDERC* 227-230. 10.1109/ESSDERC.2003.1256855. However, the studies reported there did not relate to the thermal performance of the meandering structure.

We reasoned, however, that as a heat source on a semiconductor substrate, a meandering gate would transfer heat more efficiency than a rectilinear gate for reasons similar to those that apply to heat-exchange channels with fluid flow.

It is also noteworthy that because each meandering gate is longer than a rectilinear gate having the same span across the device area in the x-direction, the meandering design packs more periphery within the same span; i.e., within the same straight-line distance between the gate manifold and the drain manifold. Hence, a meandering design can have fewer gate fingers than a rectilinear design, while preserving the same total periphery. For example, a meandering gate finger can usefully contribute 30% more periphery than a rectilinear gate finger with the same span, and contributions over the rectilinear periphery of up to 100%, 200%, or even more are believed possible without increasing the span.

Reducing the total number of gate fingers can be beneficial because it can further reduce the rise in temperature at the inner gates.

Conversely, replacing a rectilinear design with a meandering design can increase the total periphery while maintaining the same total number of gate fingers.

Another potential benefit of a meandering gate is that its inductance is partially canceled as the electric current reverses direction in successive meanders. Hence for a given periphery, the meandering gate can have less inductance than a comparable rectilinear gate.

Because the cancellation will not generally be total, however, the increased periphery per gate may still be accompanied by an increased inductance. As is known in the art, inductance can limit the maximum operating frequency of a device. Hence even with the benefit of partial inductance cancellation, there still may be a design tradeoff between maximum frequency and temperature of operation.

The meandering gate described in Kroon et al., cited above, took the form of a sinusoid of constant period and amplitude. By contrast, our new geometry varies the amplitude of the meanders. Optionally, the period of the meanders may also be varied.

We refer to our new designs as tapered meandering designs. By "tapered", we mean that the amplitude of the meanders is smallest near the center of the gate finger and increases toward the ends of the gate finger.

Figure 2:
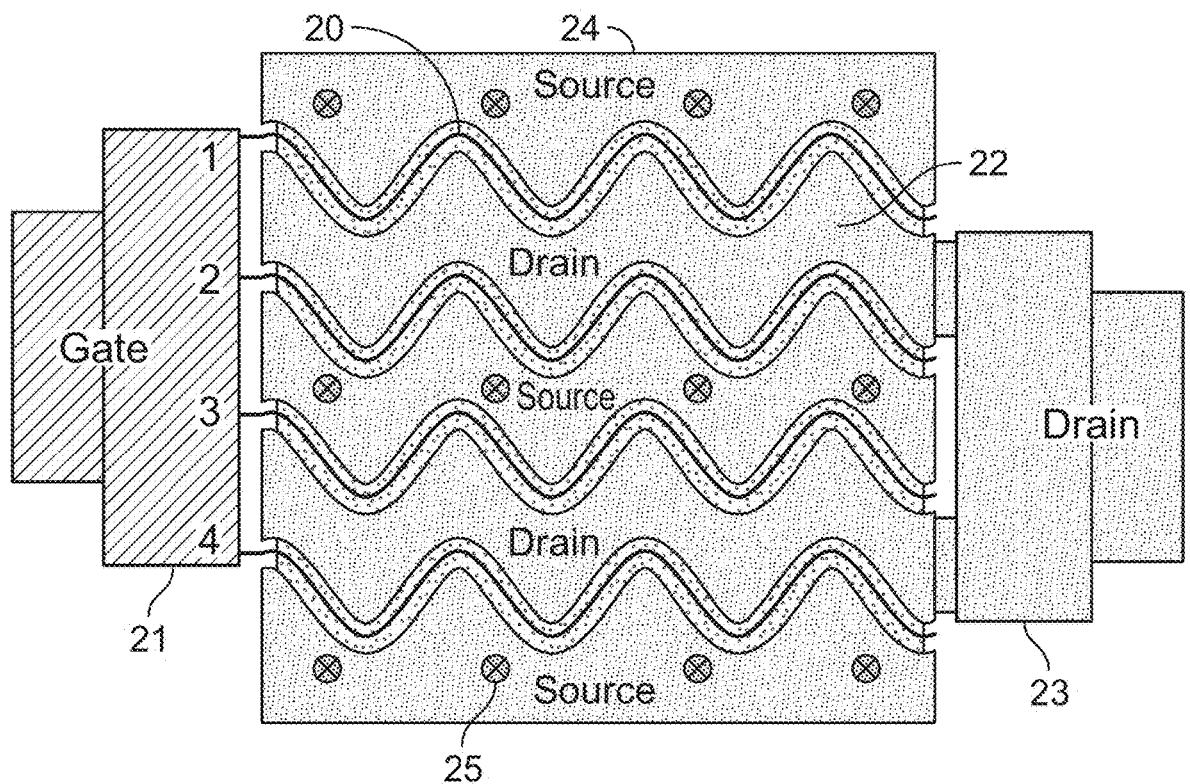
FIG. 2 is a cartoon representation, in plan view, of a meandering-gate transistor design in which the meandering gate takes the form of a sinusoid of constant period and amplitude.

FIG. 2 is a cartoon representation, in plan view, of a meandering design in which the meandering gate takes the form of a sinusoid of constant period and amplitude.

Figure 3:
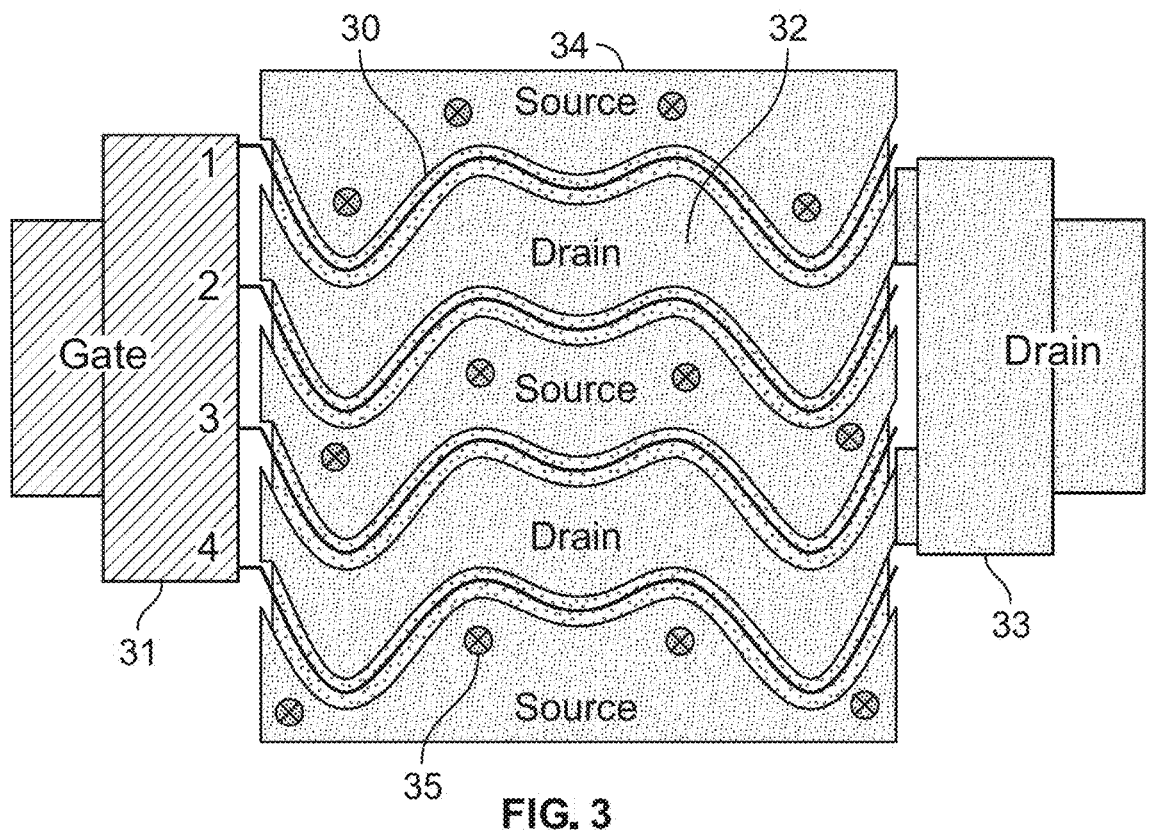
FIG. 3 is a cartoon representation, in plan view, of our new geometry for a meandering-gate transistor, in an example embodiment.

FIG. 3 is a cartoon representation, in plan view, of our new geometry in an example embodiment.

Both figures show four meandering gate fingers 20, 30 extending across the device area from the gate manifold 21, 31 on the left. Two drain fingers 22, 32 are connected to the drain manifold 23, 33 on the right. Three source islands 24, 34 are connected to ground through vias 25, 35, twelve of which are shown in each figure.

In FIG. 3, however, it is apparent that the meanders in the middle portion of the device are smaller in amplitude than the meanders in the end portions.

We developed 3D numerical models of various transistor designs having rectilinear and meandering gates, and we simulated their thermal behavior using the commercially available COMSOL Multiphysics® software package.

Figures 4A, 4B:
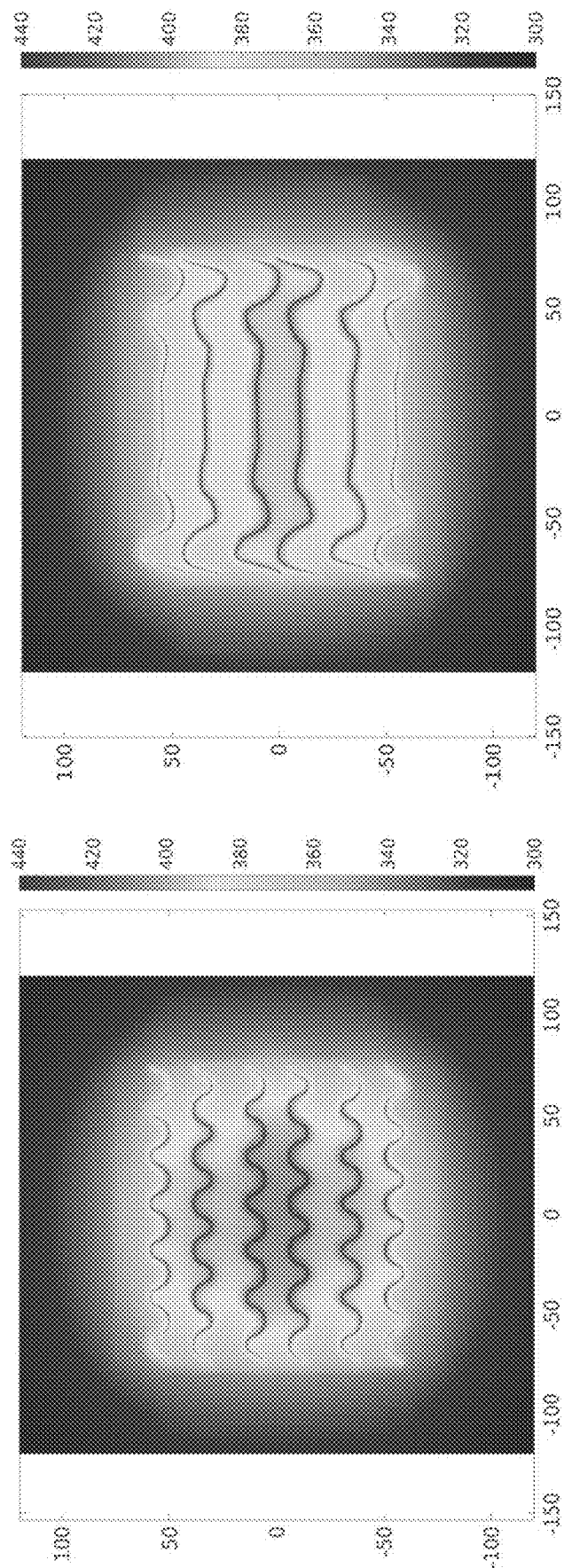
FIGS. 4A and 4B show, for comparison, temperature maps of two different meandering-gate transistor designs.

Comparative temperature maps of two different designs are shown in FIGS. 4A and 4B. FIG. 4A is the temperature map of a design in which six gate fingers are conformed as identical sinusoids of constant amplitude and period. FIG. 4B is the temperature map of a design in which the six identical gate shapes are tapered sinusoids with a modulated amplitude. The total gate periphery and the device area are the same for both designs for a fair comparison.

Figure 5:
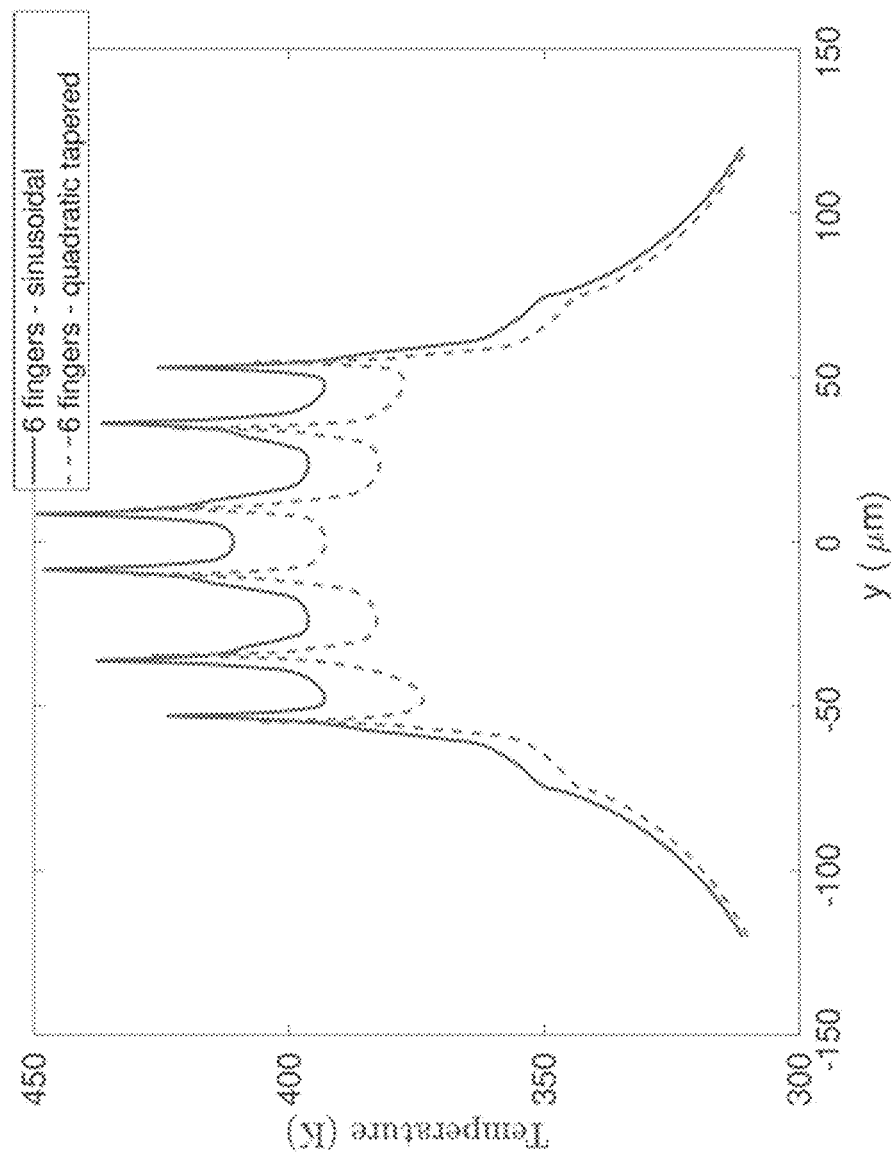
FIG. 5 is a graph of calculated temperature distributions in the temperature maps of FIGS. 4A and 4B. Each temperature distribution is taken along a cut-line similar to the cut-line of FIG. 1B. The upper distribution plotted (solid line) in the figure corresponds to the map shown in FIG. 4A, and the lower distribution (dashed line) corresponds to the map shown in FIG. 4B.

FIG. 5 is a graph of calculated temperature distributions in the temperature maps of FIGS. 4A and 4B. Each temperature distribution is taken along a cut-line similar to the cut-line of FIG. 1B. The upper distribution (solid line) plotted in the figure corresponds to the temperature map of FIG. 4A, and the lower distribution (dashed line) corresponds to the map of FIG. 4B.

The general equation for the shape of the tapered gates is $M = A_m \times \sin(2\pi x/W_m) \times (4x/W_g)^n$, where x is the positive or negative distance along the x-axis as measured from the center of the image area, $A_m$ is an amplitude, $W_m$ is the period of the sinusoid, $W_g$ is a span distance across the device surface in the x-direction, and n is an exponent which equals 1 in the present example. This functional form is merely illustrative and should not be understood as limiting.

On comparison between the two temperature maps of FIGS. 4A and 4B, it will be evident that the novel tapered meandering designs has substantially reduced the maximum device temperature and improved the temperature uniformity. In fact, it can be inferred from the slice plots in FIG. 5 that the temperature difference between the two middle fingers and the fingers adjacent to them is 11K and 6.2K for the sinusoidal and the tapered designs, respectively, suggesting more uniformity in the tapered design.

This comparison is quantifiable. For example, Table 1 lists the maximum channel temperature and the standard deviation of the temperature over the area of the device for several comparative designs. The design of FIG. 4A corresponds to a sinusoidal design, the design of FIG. 4B contains a tapered design corresponding to the Quadratic Tapered 2 design in Table 1.

More generally, Table 1 compares the maximum temperature and the temperature standard deviation for an eight-finger rectilinear (i.e., "straight") design, six-finger designs with two quadratically tapered (n=2) gate designs, and the four-finger design with linearly tapered gates (n=1). The table also designates the eight-finger rectilinear design as a baseline and compares the values for the six-finger and four-finger designs with reference values calculated for the baseline design. All of the designs listed in Table 1 have the same total periphery of 800 μm and the same total device area.

For the four-fingered design with linear taper, the amplitude parameter $A_m$ was 19 μm and the period parameter $W_m$ was 65.5 μm. For the six-fingered Quadratic Tapered 2 design, the amplitude parameter $A_m$ was 5 μm and the period parameter $W_m$ was 34.41 μm.

As is evident from Table 1, the tapered meandering design provides substantial improvements over all of the other listed designs for reducing the maximum device temperature and improving the temperature uniformity.

In view of the rule-of-thumb that each 10° C. rise in channel temperature halves the device lifetime, it can be inferred that relative to the baseline, the tapered sinusoidal design increases the device operating lifetime two-fold.

TABLE 1

Maximum temperature and temperature standard deviation resulting from different gate designs. The total periphery (800 μm) and the total area are the same for all designs.

| | 8 Fingers | 6 Fingers | | 4 Fingers |
|---|---|---|---|---|
| | Straight | Quadratic Tapered 1 | Quadratic Tapered 2 | Linear Tapered |
| Max. Temp. (° K.) | 444 | 431.9 | 435.1 | 437.5 |
| $T_{REF}$-$T_{Max}$ (° K.) | $T_{REF}$ | 12.1 | 8.9 | 6.5 |
| Temp. S.D. (° K.) | 33.4 | 31.3 | 32.1 | 32.3 |
| $SD_{REF}$-SD (° K.) | $SD_{REF}$ | 2.1 | 1.3 | 1.1 |

Fabrication

Methods for fabricating AlGaN/GaN HEMTs and other transistors useful in the present context are known in the art and need not be described here in detail.

For purposes of illustration, an example process for fabricating an AlGaN/GaN HEMT will now be briefly described.

The fabrication process begins with a substrate of a suitable material. Because of the advantages of MOS compatibility and the possibility of multilevel metallization, a choice of silicon for the substrate material may be preferable. However, more typical substrate materials include sapphire and silicon carbide, and less common alternatives include aluminum nitride.

The III-V layers are deposited on the substrate heteroepitaxially by molecular beam epitaxy or metal-organic chemical vapor deposition. It is also possible to grow the layers by vapor-phase epitaxy on a resistive GaN buffer.

The substrate growth surface is typically prepared by growing a nucleation layer. For example, a nucleation layer of GaN or AlN is deposited at low temperature on a sapphire substrate surface and then heated to the growth temperature for the principal layers. A silicon carbide surface is prepared by depositing a nucleation layer of aluminum nitride. Aluminum nitride is also a typical nucleation layer for growth on silicon.

The active device area is conventionally defined, for example by a mesa etch or by ion implantation. The gate, source and drain are then formed by metal deposition.

In examples, the source and drain have the same metal stack and are deposited concurrently using a suitably patterned mask. The gate metal, which may be different from the source and drain metal, is deposited in a separate process step using a different mask. The patterning for the source and drain is dictated by the patterning for the gate. The last step in the fabrication is deposition of a silicon nitride passivation layer. Conventional back end-of-line (BEOL) processing is used to add vias and metallization layers. Air bridges may also be added, if desired.

The ideas discussed here have been presented in the context of an AlGaN/GaN HEMT. However, the inventive principles are not limited to GaN technology. Rather, they are applicable to multi-channel transistor layouts in any of various other technologies and other material systems, such as silicon power MOSFET and GaAs MESFET technologies. Accordingly, our chosen context of AlGaN/GaN HEMT technology should be understood as merely illustrative and not as limiting the scope of the present invention.

What is claimed is:

1. A transistor apparatus of the kind in which a gate electrode includes one or more gate fingers that extend laterally across an active device area between one or more source fingers and one or more drain fingers, wherein:

at least one gate finger describes two or more in-plane meanders about an average path across the active device area;

a shape of the two or more in-plane meanders comprises an amplitude-modulated sinusoid; and the two or more in-plane meanders are tapered such that a taper amplitude is smallest in a central part of the gate finger and increases toward end portions of the gate finger.

2. The transistor apparatus of claim 1, wherein the one or more gate fingers comprises a plurality of gate fingers wherein each gate finger of said plurality describes two or more said tapered in-plane meanders.

3. The transistor apparatus of claim 2, wherein each gate finger of said plurality has an average path, and wherein two or more of the average paths are curved paths.

4. The transistor apparatus of claim 1, wherein the shape of the two or more in-plane meanders comprises an amplitude-modulated sinusoid having a period that is also modulated.

5. The transistor apparatus of claim 1, comprising at least one HEMT.

6. The transistor apparatus of claim 1, comprising at least one AlGaN/GaN HEMT.

7. The transistor apparatus of claim 1, wherein the amplitude of each in-plane meander is a smooth function of lateral position along an axis that crosses the active device area.

8. The transistor apparatus of claim 1, wherein the amplitude of each in-plane meander is a function of lateral position along an axis that crosses the active device area, and wherein said function increases from the central part of the gate finger toward the end portions of the gate finger.

9. The transistor apparatus of claim 1, wherein each gate finger has at least three in-plane meanders.

10. The transistor apparatus of claim 1, wherein each gate finger has at least three but not more than eight in-plane meanders.

11. The transistor apparatus of claim 1, wherein:

each gate finger has a span, defined as a straight-line end-to-end distance that the gate finger extends across the active device area; and at least one gate finger having tapered in-plane meanders has an arc length at least 30% greater than its span.

12. The transistor apparatus of claim 1, wherein:

each gate finger has a span, defined as a straight-line end-to-end distance that the gate finger extends across the active device area; and at least one gate finger having tapered in-plane meanders has an arc length greater than its span by 30%-200%.

13. The transistor apparatus of claim 1, comprising a plurality of p gate fingers having tapered in-plane meanders, wherein:

each said gate finger has a span s defined as a straight-line end-to-end distance that the gate finger extends across the active device area;
the plurality of fingers having tapered in-plane meanders collectively has a total gate width; and
said total gate width is at least 30% greater than the total gate width of p rectilinear fingers of span s.

14. The transistor apparatus of claim 1, wherein the one or more gate fingers comprises a plurality of p gate fingers having tapered in-plane meanders, wherein:
each said gate finger has a span s defined as a straight-line end-to-end distance that the gate finger extends across the active device area;
the plurality of fingers having tapered in-plane meanders collectively has a total gate width; and
said total gate width is greater than the total gate width of p rectilinear fingers of span s by 30%-200%.

15. The transistor apparatus of claim 1, wherein the shape of the two or more in-plane meanders of the at least one gate finger comprises an amplitude-modulated sinusoid with a linear taper such that the amplitude is proportional to a distance measured from a central point on the gate finger.

16. The transistor apparatus of claim 1, wherein the shape of the two or more in-plane meanders of the at least one gate finger comprises an amplitude-modulated sinusoid with a quadratic taper such that the amplitude is proportional to the square of a distance measured from a central point on the gate finger.

17. The transistor apparatus of claim 1, wherein the one or more gate fingers comprises at least two gate fingers that extend laterally across the active device area.

* * * * *